(12) United States Patent
Li et al.

(10) Patent No.: US 9,378,953 B2
(45) Date of Patent: Jun. 28, 2016

(54) METHOD FOR PREPARING POLYCRYSTALLINE METAL OXIDE PATTERN

(71) Applicants: BOE TECHNOLOGY GROUP CO., LTD., Beijing (CN); BEIJING BOE DISPLAY TECHNOLOGY CO., LTD., Beijing (CN)

(72) Inventors: Liangliang Li, Beijing (CN); Zongjie Guo, Beijing (CN); Huibin Guo, Beijing (CN); Shoukun Wang, Beijing (CN); Yuchun Feng, Beijing (CN); Xiaowei Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/526,777

(22) Filed: Oct. 29, 2014

(65) Prior Publication Data

US 2015/0329432 A1 Nov. 19, 2015

(30) Foreign Application Priority Data

May 14, 2014 (CN) .......................... 2014 1 0204209

(51) Int. Cl.
*H01L 21/00* (2006.01)
*H01L 21/84* (2006.01)
(Continued)

(52) U.S. Cl.
CPC ...... *H01L 21/02691* (2013.01); *C04B 41/0036* (2013.01); *C04B 41/0072* (2013.01);
(Continued)

(58) Field of Classification Search
None
See application file for complete search history.

(56) References Cited

U.S. PATENT DOCUMENTS 6,448,158 B2 * 9/2002 Peng .................. H01L 31/1884
438/482

(Continued)

FOREIGN PATENT DOCUMENTS

CN 1450395 A 10/2003
CN 103681244 A 3/2014
(Continued)

OTHER PUBLICATIONS

Hosono et al., "Excimer Laser Crystallization of Amorphous Indium-Tin-Oxide and Its Application to Fine Patterning", Jpn J. Applied Physics, vol. 37 (1998) pp. L1119-L1121.*

(Continued)

*Primary Examiner* — Sonya D McCall Shepard
(74) *Attorney, Agent, or Firm* — Nath, Goldberg & Meyer; Joshua B. Goldberg

(57) ABSTRACT

Disclosed is a method for preparing a polycrystalline metal oxide pattern, characterized by comprising: annealing a predetermined region of an amorphous metal oxide film by laser, so as to convert the amorphous metal oxide in the predetermined region into a polycrystalline metal oxide; and etching the amorphous metal oxide outside of the predetermined region so as to remove it. By the method according to the present invention, firstly, the predetermined region of an amorphous metal oxide film is annealed by laser so as to convert the amorphous metal oxide into a polycrystalline metal oxide, and then, the amorphous metal oxide outside of the predetermined region is etched away, thereby a polycrystalline metal oxide pattern is formed. The method for preparing a polycrystalline metal oxide pattern according to the present invention is simple, and can effectively shorten the production period and save production costs.

5 Claims, 4 Drawing Sheets

(51) Int. Cl.
*H01L 21/02* (2006.01)
*C04B 41/91* (2006.01)
*C04B 41/00* (2006.01)
*C04B 41/53* (2006.01)

(52) U.S. Cl.
CPC ............ *C04B41/5353* (2013.01); *C04B 41/91* (2013.01); *H01L 21/02422* (2013.01); *H01L 21/02554* (2013.01); *H01L 21/02565* (2013.01); *H01L 21/02631* (2013.01); *H01L 21/02686* (2013.01)

(56) References Cited

U.S. PATENT DOCUMENTS

| | | | |
|---|---|---|---|
| 7,342,637 B2* | 3/2008 | Kim | G02F 1/13439 349/139 |
| 7,994,029 B2* | 8/2011 | Cheng | H01J 9/02 438/487 |
| 2009/0221141 A1 | 9/2009 | Cheng et al. | |
| 2010/0320459 A1* | 12/2010 | Umeda | H01L 21/02554 257/43 |

FOREIGN PATENT DOCUMENTS

| JP | H08339960 A | 12/1996 |
|---|---|---|
| JP | 2001179167 A | 7/2001 |

OTHER PUBLICATIONS

Office Action dated Mar. 31, 2016 issued in corresponding Chinese Application No. 201410204209.X.

\* cited by examiner

METHOD FOR PREPARING POLYCRYSTALLINE METAL OXIDE PATTERN

FIELD OF THE INVENTION

The present invention relates to the technical field of display, and particularly relates to a method for preparing a polycrystalline metal oxide pattern.

BACKGROUND

Indium tin oxide (ITO) films have been widely used in the technical field of flat panel display, for they are transparent to visible light and have good conductivity, high reflectivity to infrared light, and the like.

Currently, the major method for preparing ITO pattern mainly comprises processes of film formation, exposure, etching, stripping, annealing and the like. FIG. 1 shows the flow diagram of a prior method for preparing a polycrystalline ITO pattern. As shown in FIG. 1, this method comprises:

Step 101: depositing an amorphous ITO film on a base substrate;

Step 102: performing the patterning process to the amorphous ITO film;

Step 103: annealing the amorphous ITO film having a predetermined pattern by heating, so as to convert the amorphous ITO film into a polycrystalline ITO film.

FIG. 2 is a schematic diagram showing an amorphous ITO film deposited on a base substrate. As shown in FIG. 2, an amorphous ITO film 2 with uniform thickness is deposited on a base substrate 1 by Physical Vapor Deposition (hereinafter referred to as PVD).

FIGS. 3a-3c are schematic diagrams showing the patterning processes of the amorphous ITO film, wherein FIG. 3a is a schematic diagram showing a state in which the photoresist is coated on the amorphous ITO film, and exposing and developing has been performed thereafter; FIG. 3b is a schematic diagram showing a state in which wet etching is performed to the amorphous ITO film; FIG. 3c is a schematic diagram showing a state of the amorphous ITO film after stripping. As shown in FIGS. 3a-3c, in step 102, the etching of the amorphous ITO film 2 is completed by patterning process so as to form the amorphous ITO film into a predetermined pattern, and then the photoresist 3 on the amorphous ITO film is stripped by a photoresist stripping solution.

FIG. 4 is a schematic diagram showing a polycrystalline ITO obtained from the amorphous ITO of FIG. 3c by heat-annealing treatment. As shown in FIG. 4, the amorphous ITO pattern is converted to a polycrystalline ITO pattern 4 by performing heat-annealing treatment of the amorphous ITO of FIG. 3c, wherein the heat-annealing treatment generally comprises heating at 200 to 300° C. for 20 to 30 minutes and then cooling for 4 to 10 minutes, so as to convert the amorphous ITO into a polycrystalline ITO.

It can be seen from the above that, many kinds of organic solvents are used in the patterning in this method for preparing polycrystalline ITO pattern, and the conversion of the amorphous ITO into polycrystalline ITO involves heat-annealing. This method involves many disadvantages such as complicated processes, strict operation condition, long production period and high cost. Moreover, the organic solvents used in this method are difficult to deal with and contaminates the environment, and said heat-annealing consumes long time while heating may affect other components in the display device.

SUMMARY OF THE INVENTION

An object of the present invention is to provide a method for preparing polycrystalline metal oxide pattern, according to which the production period can be shorten and production costs reduced.

The object described above is achieved by a method for preparing a polycrystalline metal oxide pattern, comprising:

annealing a predetermined region of an amorphous metal oxide film by laser so as to convert the amorphous metal oxide in the predetermined region into a polycrystalline metal oxide; and etching the amorphous metal oxide outside of the predetermined region so as to remove it.

Optionally, the step of annealing a predetermined region of an amorphous metal oxide film by laser comprises:

irradiating the predetermined region of the amorphous metal oxide film by a laser source.

Alternatively, the laser source is a point light source of laser. In this case, said step of irradiating the predetermined region of the amorphous metal oxide film by a laser source comprises:

the laser generated from a point light source scans the predetermined region on the amorphous metal oxide film.

Alternatively, the laser source includes a plurality of point light sources of laser. In this case, said step of irradiating the predetermined region of the amorphous metal oxide film by a laser source comprises:

the laser generated from each point light source are processed by an optical system so as to form projections of each of the laser point light source on the amorphous metal oxide film, wherein the shape constituted by the projections of all the laser point light source is the same as that of the predetermined region.

Alternatively, the laser source is a line light source of laser or a surface light source of laser, and a mask is provided between the source of laser and the amorphous metal oxide film.

In this case, said step of irradiating the predetermined region of the amorphous metal oxide film by a laser source comprises:

the laser source reciprocates between the two ends of the mask at the opposite side of the amorphous metal oxide film, and the laser generated from the laser source irradiates the predetermined region of the amorphous through the mask.

Alternatively, the reciprocation of the laser source is in uniform motion or stepwise motion manner.

Alternatively, the laser source is an ultraviolet excimer laser source.

Alternatively, the etching process is a wet etching.

Alternatively, before the step of annealing the predetermined region of the amorphous metal oxide film by laser, the method according to the present invention further comprising: forming an amorphous metal oxide film on a base substrate.

Alternatively, the metal oxide is any one of tin oxide, indium tin oxide, indium tin zinc oxide, and indium gallium zinc oxide.

By the method for preparing a polycrystalline metal oxide pattern according to the present invention, firstly, the predetermined region of an amorphous metal oxide film is annealed by laser so as to convert the amorphous metal oxide into a polycrystalline metal oxide, and then, the amorphous metal oxide outside of the predetermined region is etched away, thereby a polycrystalline metal oxide pattern is formed. The method for preparing a polycrystalline metal oxide pattern according to the present invention is simple, and can effectively shorten the production period and save production costs.

DETAILED DESCRIPTION OF CERTAIN EMBODIMENTS

Hereinafter, the embodiments of the present invention will be described in detail with reference to the accompanying figures, so that a person skilled in the art can get a better understanding of the technical solutions of the invention.

Figure 5:
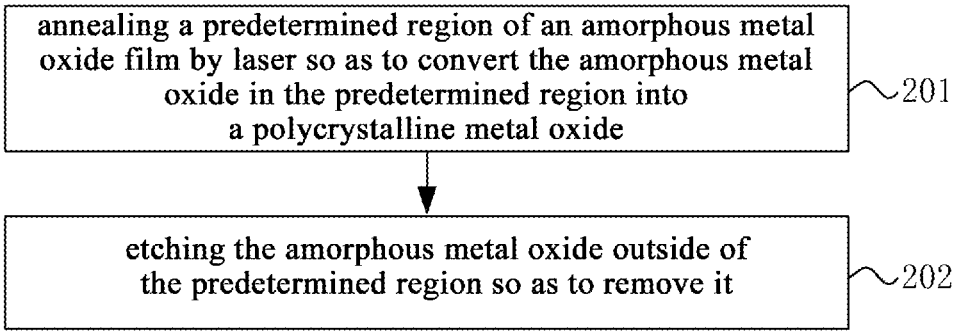
FIG. 5 is a flowchart of the method for preparing a polycrystalline metal oxide pattern according to an embodiment of the present invention.

As shown in FIG. 5, the method for preparing a polycrystalline metal oxide pattern according to an embodiment of the present invention comprises:

Step 201: irradiating the predetermined region of an amorphous metal oxide film by a laser source to anneal the predetermined region, so as to convert the amorphous metal oxide in the predetermined region into polycrystalline metal oxide;

Step 202: etching the amorphous metal oxide outside of the predetermined region so as to remove it.

The metal oxides include but not limited to tin oxide (TO), indium tin oxide (ITO), indium tin zinc oxide (ITZO), and indium gallium zinc oxide (IGZO). It should be noted that the predetermined region according to the present invention is designed according to the polycrystalline metal oxide pattern as desired.

There are multiple technical solutions to achieve the process of Step 201. As an optional solution, the laser source may be a point light source of laser, and the laser generated thereby scans the predetermined region of the amorphous metal oxide film. As the projection of the laser from a point light source on the amorphous metal oxide film only covers a small area, the annealing of the amorphous metal oxide in a predetermined region can be completed in a manner of scanning. By this way, the region in which a polycrystalline metal oxide is to be formed can be precisely controlled, and the accuracy of the process can be improved.

As another alternative solution, the laser source may include a plurality of point light sources. The laser generated from each point light source are processed by an optical system so as to form projections of each of the laser on the amorphous metal oxide film, wherein the shape constituted by the projections of all of the laser is the same as that of the predetermined region. In this case, the annealing of the predetermined region by laser can be completed without scanning.

Figure 6:
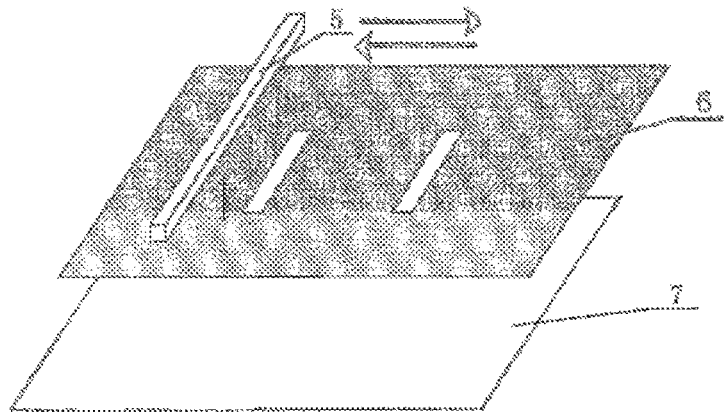
FIG. 6 is a schematic diagram of the annealing treatment by laser generated form a line light source of laser according to an embodiment of the present invention.

As yet another alternative solution, the laser light source may also be a line light source of laser or a surface light source of laser, and a mask is provided between the source of laser and the amorphous metal oxide film. FIG. 6 is a schematic diagram of annealing by using a line light source of laser. As shown in FIG. 6, take a line light source of laser as an example, a laser line light source 5 reciprocates within the two ends of a mask 6 at the opposite side of the amorphous metal oxide film. The material of mask 6 is transparent (usually quartz), and portion(s) of the mask is covered with a light-shielding film layer used for absorbing and/or shielding the laser generated from the line light source 5, while the other portion(s) of the mask without light-shielding film layer allows the laser to pass through and irradiate the predetermined region of the amorphous metal oxide film 7. The annealing by laser of the amorphous metal oxide film 7 in the whole predetermined region can be completed by the reciprocation of the laser line light source 5.

Alternatively, the reciprocation of line light source 5 may be in a manner of uniform motion or stepwise motion, thereby ensuring the uniformity of the annealing treatment by laser.

It should be noted that, when the laser source is a surface light source, the annealing treatment is similar to that of a laser line light source and need not to be repeated.

In the above-mentioned annealing processes, the laser source may be an ultraviolet excimer laser source which generates ultraviolet excimer laser. Ultraviolet excimer laser is a laser having a wavelength of 157-353 nm which is generated by the transition of the molecules of a mixture gas including noble gas and halogen gas from its excited state to ground state. Ultraviolet excimer laser belongs to cold laser, and it has no thermal effect, so that it can effectively avoid the influence on other components of a display device during the annealing treatment by laser. In addition, ultraviolet excimer laser has strong directionality, high purity of wave length and high output power, so that the accuracy of the annealing by laser can be improved, and the time of annealing can be effectively shortened.

It should be noted that, besides the ultraviolet excimer laser, other laser of the prior art such as pulse laser or CW (continues wave) laser may also be used in the annealing treatment process by laser.

Further, in step 201, the time of the annealing by laser is very short (about one millionth of conventional thermal annealing), which can avoid the adverse effect on TFT devices and other components by a prolonged heating, and effectively shorten the production period, compared with the conventional thermal annealing.

In step 202, the etching process is preferably a wet etching. The etching liquid may be acids having low concentrations or the combination thereof, for example, the mixed solution of sulfuric acid and nitric acid each having a low concentration, the mixed solution of sulfuric acid, nitric acid and acetic acid each having a low concentration, or a solution of acetic acid having a low concentration, wherein the amount of water in the solution is generally 80 wt % or more, based on the total weight of the solution. Preferably, the etching liquid is sulfuric acid. In the wet etching process, the etching liquid only reacts with the amorphous metal oxide but not with the polycrystalline metal oxide, so that only the polycrystalline metal oxide pattern is retained after the wet etching.

It should be noted that, in step 202, other etching techniques of the prior art may also be adopted to remove the amorphous metal oxide while retaining the polycrystalline metal oxides, and need not to be repeated.

As another embodiment of the present invention, the method for preparing a polycrystalline metal oxide pattern further comprises forming an amorphous metal oxide film on a base substrate. The amorphous metal oxide film may be formed by any conventional process in the art, preferably by PVD.

The above-described embodiment according to the present invention provides a method for preparing a polycrystalline metal oxide pattern, comprising firstly annealing a predetermined region of an amorphous metal oxide film by laser so as to convert the amorphous metal oxide in the predetermined region into a polycrystalline metal oxide; and then etching the amorphous metal oxide outside of the predetermined region so as to remove it. The method for preparing a polycrystalline metal oxide pattern according to the present invention is simple, and can effectively shorten the production period and save production costs.

EXAMPLE

In this example, the technical solution of the present invention is described by taking polycrystalline ITO pattern as an example. It should be noted that the present invention is not limited to the example, and it will achieve the same technical effects on other polycrystalline metal oxides. The polycrystalline metal oxides include but not limited to tin oxide (TO), indium tin oxide (ITO), indium tin zinc oxide (ITZO), and indium gallium zinc oxide (IGZO).

Figure 1:
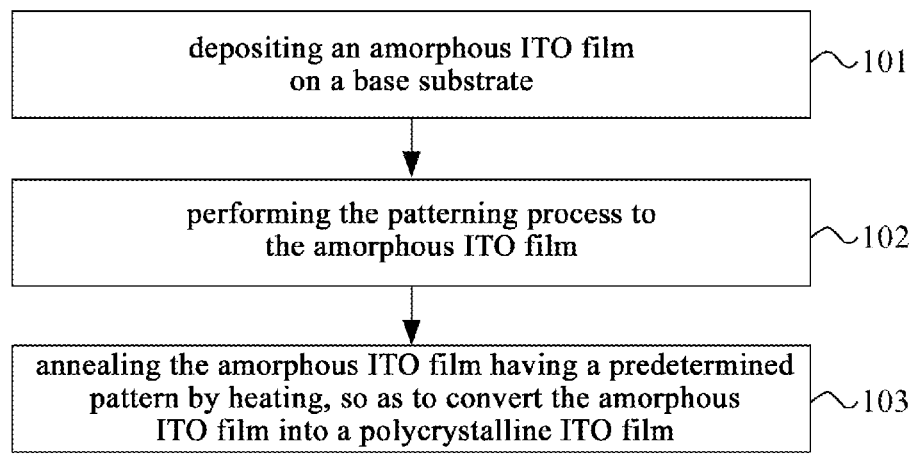
FIG. 1 is a flowchart showing the prior method for preparing a polycrystalline ITO pattern.
Figure 2:
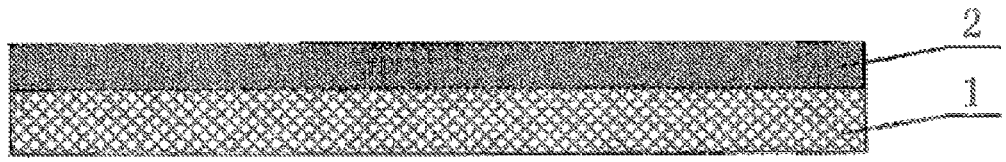
FIG. 2 is a schematic diagram showing an amorphous ITO film deposited on a base substrate by the prior technique.
Figure 3A:
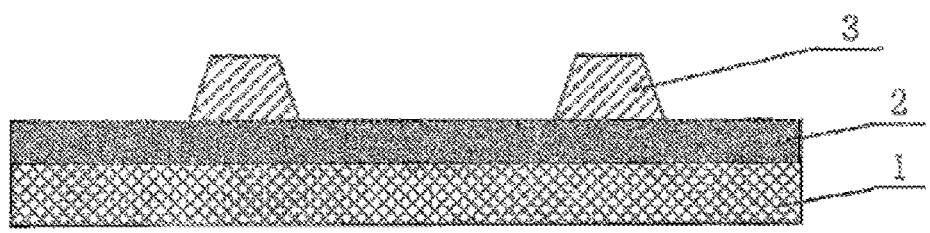
FIG. 3a is a schematic diagram showing a state in which the photoresist is coated on the amorphous ITO film layer, and exposing and developing has been performed thereafter by the prior technique.
Figure 3B:
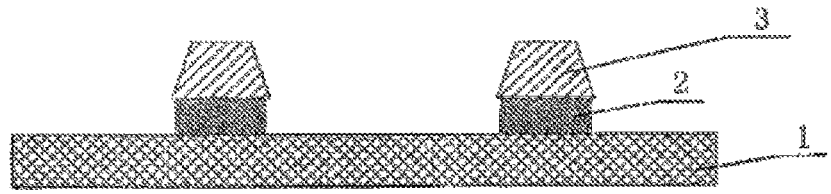
FIG. 3b is a schematic diagram showing the etching of the amorphous ITO by the prior technique.
Figure 3C:
FIG. 3c is a schematic diagram showing the state in which the photoresist is stripped by the prior technique.
Figure 4:
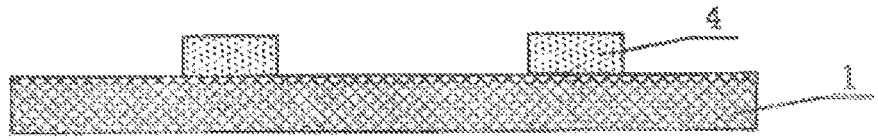
FIG. 4 is a schematic diagram showing a polycrystalline ITO obtained from the amorphous ITO of FIG. 3c by heat-annealing treatment.
Figure 7:
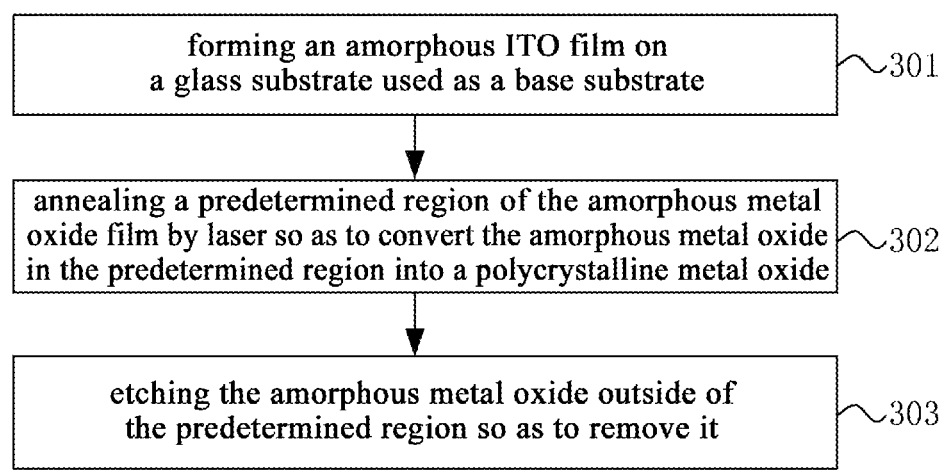
FIG. 7 is a flowchart of the method for preparing a polycrystalline metal oxide pattern according to an embodiment of the present invention.

FIG. 7 is a flowchart of the method for preparing a polycrystalline metal oxide pattern according to this example. As shown in FIG. 7, the method comprises:

Step 301: forming an amorphous ITO film on a glass substrate used as a base substrate A uniform PVD amorphous ITO film is formed on a base substrate 1 using ITO target material (purchased from Samsung Corning Precision Materials Co., Ltd.) through magnetron sputtering techniques by using a magnetron sputtering device SMD-2400C (manufactured by ULVAC JAPAN Ltd.) under the condition of 25° C., 0.67 Pa of He atmosphere. The schematic diagram of an amorphous ITO film deposited on a base substrate is shown in FIG. 2.

Figure 8:
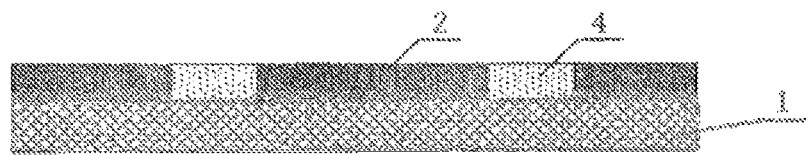
FIG. 8 is a schematic diagram of an ITO film wherein the amorphous ITO in predetermined regions has converted into polycrystalline ITO according to the present invention.

Step 302: annealing a predetermined region of the amorphous metal oxide film by laser so as to convert the amorphous metal oxide in the predetermined region into a polycrystalline metal oxide FIG. 8 is a schematic diagram of an ITO film wherein the amorphous ITO in predetermined regions has been converted into polycrystalline ITO. As shown in FIG. 8, XeCl excimer laser device LPXpro C-version (emission wavelength: 308 nm, manufactured by Coherent Inc.) is used as a laser source, and the linear scan of laser is performed by using the light path, wherein the times of the scanning is controlled to about 10 pulses, and the frequency thereof is 50 Hz. During the scanning, the region that ITO need not to be retained is shielded by a mask, so that the amorphous ITO in the region that is not shielded is converted into polycrystalline ITO, thereby the amorphous ITO film 2 in the predetermined region can be converted into polycrystalline ITO film 4.

Step 303: etching the amorphous metal oxide outside of the predetermined region so as to remove it In step 303, the amorphous ITO on the base substrate is etched away by wet etching using the ITO etching liquid DIE-A09 (main component: mixed solution of sulfuric acid and nitric acid each having a low concentration, manufactured by Donjin Communication Technology Co. Ltd.), thereby only the polycrystalline ITO pattern (i.e. polycrystalline ITO film 4) is remained on the base substrate 1. Then the base substrate 1 is washed by using deionized water to remove the residue of the etching liquid on the substrate.

Compared with the prior art, the method for preparing a polycrystalline ITO pattern according to the present invention is simple, and can effectively shorten the production period and save production costs. Meanwhile, there is no requirement to use organic solvents in the method provided in the present invention, which further guarantees the safety of operator.

It should be understood that the present invention is not limited to the above-illustrated embodiments, which were chosen and described in order to best explain the principles of the invention. Those skilled in the art can make various modifications or variations without departing from the spirit and essence of the present invention. It is intended that the scope of the invention be defined by the following claims and their equivalents.

The invention claimed is:

1. A method for preparing a polycrystalline metal oxide pattern, characterized by comprising:
    annealing a predetermined region of an amorphous metal oxide film by irradiating it with laser light, so as to convert the amorphous metal oxide in the predetermined region into a polycrystalline metal oxide; and
    etching the amorphous metal oxide outside of the predetermined region so as to remove it,
    wherein the annealing step comprises:
    using a plurality of point light sources of laser as a laser light source, and the laser generated from each of the plurality of point light sources are processed by an optical system so as to form projections of each of the plurality of laser point light sources on the amorphous metal oxide film, wherein the shape constituted by the projections of all the plurality of laser point light sources is the same as that of the predetermined region,
    wherein the predetermined region represents as a part of the amorphous metal oxide film, not the whole area of the amorphous metal oxide film.

2. The method for preparing a polycrystalline metal oxide pattern according to claim 1, characterized in that the laser source is an ultraviolet excimer laser source.

3. The method for preparing a polycrystalline metal oxide pattern according to claim 1, characterized in that the etching process is a wet etching.

4. The method for preparing a polycrystalline metal oxide pattern according to claim 1, characterized by further comprising: forming an amorphous metal oxide film on a base substrate before the step of annealing the predetermined region of the amorphous metal oxide film by laser.

5. The method for preparing a polycrystalline metal oxide pattern according to claim 1, characterized in that the metal oxide is any one of tin oxide, indium tin oxide, indium tin zinc oxide, and indium gallium zinc oxide.

* * * * *